US012772901B2

(12) United States Patent
Scott et al.

(10) Patent No.: US 12,772,901 B2
(45) Date of Patent: Oct. 20, 2026

(54) LASER LIFT-OFF PROCESSING SYSTEM INCLUDING METAL GRID

(71) Applicant: Lumileds LLC, San Jose, CA (US)

(72) Inventors: Dennis Scott, Dublin, CA (US); Chee Chung James Wong, Singapore (SG); Khing Lim Hii, Singapore (SG); Pei-Chee Mah, Singapore (SG); Saraswati, Singapore (SG)

(73) Assignee: LUMILEDS SINGAPORE PTE. LTD., Singapore (SG)

( * ) Notice: Subject to any disclaimer, the term of this patent is extended or adjusted under 35 U.S.C. 154(b) by 833 days.

(21) Appl. No.: 17/797,779

(22) PCT Filed: Mar. 1, 2021

(86) PCT No.: PCT/US2021/020187
§ 371 (c)(1),
(2) Date: Aug. 5, 2022

(87) PCT Pub. No.: WO2021/183310
PCT Pub. Date: Sep. 16, 2021

(65) Prior Publication Data

US 2023/0068911 A1 Mar. 2, 2023

Related U.S. Application Data

(60) Provisional application No. 62/987,915, filed on Mar. 11, 2020.

(51) Int. Cl.
*H10W 90/00* (2026.01)
*H05B 33/26* (2006.01)
(Continued)

(52) U.S. Cl.
CPC ............ *H10W 90/00* (2026.01); *H05B 33/26* (2013.01); *H10H 20/018* (2025.01); *H10H 29/142* (2025.01)

(58) Field of Classification Search
CPC .. H01L 25/0753; H05B 33/26; H10H 20/018; H10H 20/01335; H10W 90/00
See application file for complete search history.

(56) References Cited

U.S. PATENT DOCUMENTS

| | | | |
|---|---|---|---|
| 6,410,942 | B1 | 6/2002 | Thibeault et al. |
| 6,657,236 | B1 | 12/2003 | Thibeault et al. |

(Continued)

FOREIGN PATENT DOCUMENTS

| | | | |
|---|---|---|---|
| CN | 108365061 | A | 8/2018 |
| CN | 110034212 | A | 7/2019 |

(Continued)

OTHER PUBLICATIONS

"Extended European Search Report in 20172125.5-1211, Sep. 28, 2020, 7 pages".

*Primary Examiner* — Shih Tsun A Chou
(74) *Attorney, Agent, or Firm* — Servilla Whitney LLC

(57) ABSTRACT

A method of manufacturing a light emitting diode (LED) device includes forming an LED structure by depositing a plurality of semiconductor layers on a transparent substrate. Trenched metal is placed in the plurality of semiconductor layers, with the trenched metal contacting the transparent substrate. The LED structure is attached to a CMOS structure with electrical interconnects that define a cavity therebetween. Laser light is used to provide laser lift-off of the transparent substrate from the plurality of semiconductor layers.

5 Claims, 4 Drawing Sheets

(51) Int. Cl.
*H10H 20/01* (2025.01)
*H10H 29/14* (2025.01)

(56) References Cited

U.S. PATENT DOCUMENTS

| | | | |
|---|---|---|---|
| 6,821,804 | B2 | 11/2004 | Thibeault et al. |
| 8,222,811 | B2 | 7/2012 | Vaufrey et al. |
| 8,258,044 | B2 | 9/2012 | Brun et al. |
| 8,487,340 | B2 | 7/2013 | Gilet et al. |
| 8,638,032 | B2 | 1/2014 | Maindron et al. |
| 8,647,957 | B2 | 2/2014 | Borowik et al. |
| 8,697,548 | B2 | 4/2014 | Borowik et al. |
| 8,698,396 | B2 | 4/2014 | Maindron et al. |
| 8,890,111 | B2 | 11/2014 | Templier et al. |
| 9,093,607 | B2 | 7/2015 | Gilet et al. |
| 9,109,296 | B2 | 8/2015 | Metaye et al. |
| 9,112,112 | B2 | 8/2015 | Do et al. |
| 9,192,290 | B2 | 11/2015 | Spinnler et al. |
| 9,209,366 | B2 | 12/2015 | Maindron et al. |
| 9,263,633 | B2 | 2/2016 | Gilet et al. |
| 9,396,970 | B2 | 7/2016 | Gillot et al. |
| 9,422,628 | B2 | 8/2016 | Simonato et al. |
| 9,496,465 | B2 | 11/2016 | Sugimoto et al. |
| 9,507,204 | B2 | 11/2016 | Pelka et al. |
| 9,583,469 | B2 | 2/2017 | Hsieh |
| 9,601,542 | B2 | 3/2017 | Robin et al. |
| 9,722,160 | B2 | 8/2017 | Nakabayashi |
| 9,768,350 | B2 | 9/2017 | Bavencove et al. |
| 9,887,184 | B2 | 2/2018 | Takeya et al. |
| 9,945,526 | B2 | 4/2018 | Singer et al. |
| 9,978,727 | B2 | 5/2018 | Takeya et al. |
| 9,997,688 | B2 | 6/2018 | Takeya et al. |
| 10,002,928 | B1 | 6/2018 | Raring et al. |
| 10,018,325 | B2 | 7/2018 | Kim et al. |
| 10,050,026 | B2 | 8/2018 | Takeya et al. |
| 10,068,884 | B2 | 9/2018 | Takeya et al. |
| 10,145,518 | B2 | 12/2018 | Do et al. |
| 10,964,845 | B2 | 3/2021 | Dimitropoulos et al. |
| 2006/0159909 | A1* | 7/2006 | Aslan ...................... B29C 33/58 428/323 |
| 2008/0061312 | A1 | 3/2008 | Gao et al. |
| 2009/0101929 | A1 | 4/2009 | Mo et al. |
| 2011/0018013 | A1 | 1/2011 | Margalith et al. |
| 2011/0151607 | A1 | 6/2011 | Landis et al. |
| 2011/0287606 | A1 | 11/2011 | Brun et al. |
| 2012/0205614 | A1 | 8/2012 | Templier et al. |
| 2013/0020115 | A1 | 1/2013 | Mataye et al. |
| 2013/0112945 | A1 | 5/2013 | Gilet et al. |
| 2014/0077156 | A1 | 3/2014 | Bavencove et al. |
| 2014/0094878 | A1 | 4/2014 | Gossler et al. |
| 2014/0138719 | A1 | 5/2014 | Maindron et al. |
| 2015/0118544 | A1 | 4/2015 | Oukassi |
| 2015/0144590 | A1 | 5/2015 | Simonato et al. |
| 2015/0228873 | A1 | 8/2015 | Gebuhr et al. |
| 2015/0280060 | A1 | 10/2015 | Gilet et al. |
| 2015/0380461 | A1 | 12/2015 | Robin et al. |
| 2016/0079565 | A1 | 3/2016 | Maindron et al. |
| 2016/0190400 | A1 | 6/2016 | Jung et al. |
| 2016/0218240 | A1 | 7/2016 | Bouvier et al. |
| 2016/0293811 | A1 | 10/2016 | Hussell et al. |
| 2017/0080457 | A1 | 3/2017 | Eymery et al. |
| 2017/0098746 | A1 | 4/2017 | Bergmann et al. |
| 2017/0137645 | A1 | 5/2017 | Manceau et al. |
| 2017/0186612 | A1 | 6/2017 | Almadori et al. |
| 2017/0243860 | A1 | 8/2017 | Hong et al. |
| 2017/0293065 | A1 | 10/2017 | Kim |
| 2017/0358563 | A1 | 12/2017 | Cho et al. |
| 2017/0358724 | A1 | 12/2017 | Shichijo et al. |
| 2018/0017939 | A1 | 1/2018 | Allier et al. |
| 2018/0019369 | A1 | 1/2018 | Cho et al. |
| 2018/0019373 | A1 | 1/2018 | Lehnhardt et al. |
| 2018/0061316 | A1 | 3/2018 | Shin et al. |
| 2018/0074372 | A1 | 3/2018 | Takeya et al. |
| 2018/0090540 | A1 | 3/2018 | Von Malm et al. |
| 2018/0138157 | A1 | 5/2018 | Im et al. |
| 2018/0145059 | A1 | 5/2018 | Welch et al. |
| 2018/0149328 | A1 | 5/2018 | Cho et al. |
| 2018/0156406 | A1 | 6/2018 | Feil et al. |
| 2018/0166470 | A1 | 6/2018 | Chae |
| 2018/0174519 | A1 | 6/2018 | Kim et al. |
| 2018/0174931 | A1 | 6/2018 | Henley |
| 2018/0210282 | A1 | 7/2018 | Song et al. |
| 2018/0238511 | A1 | 8/2018 | Hartmann et al. |
| 2018/0259137 | A1 | 9/2018 | Lee et al. |
| 2018/0259570 | A1 | 9/2018 | Henley |
| 2018/0272605 | A1 | 9/2018 | Gmeinsieser et al. |
| 2018/0283642 | A1 | 10/2018 | Liao et al. |
| 2018/0297510 | A1 | 10/2018 | Fiederling et al. |
| 2018/0339643 | A1 | 11/2018 | Kim |
| 2018/0339644 | A1 | 11/2018 | Kim |
| 2018/0354406 | A1 | 12/2018 | Park |
| 2019/0123033 | A1* | 4/2019 | Martin .................... H01L 25/18 |
| 2019/0206926 | A1 | 7/2019 | Diana et al. |
| 2019/0341417 | A1 | 11/2019 | Nagata et al. |
| 2019/0392751 | A1* | 12/2019 | Hsieh ................ H01L 21/02263 |
| 2021/0134773 | A1* | 5/2021 | Onuma ................ H10H 20/018 |

FOREIGN PATENT DOCUMENTS

| | | | |
|---|---|---|---|
| DE | 102010051286 | A1 | 5/2012 |
| DE | 102012109460 | A1 | 4/2014 |
| DE | 102014112551 | A1 | 3/2016 |
| EP | 1378949 | A1 | 1/2004 |
| EP | 2027608 | A1 | 2/2009 |
| EP | 2203939 | A1 | 7/2010 |
| EP | 2211387 | A2 | 7/2010 |
| EP | 2339658 | A2 | 6/2011 |
| EP | 2491591 | A1 | 8/2012 |
| EP | 2499958 | A1 | 9/2012 |
| EP | 2521161 | A1 | 11/2012 |
| EP | 2521162 | A1 | 11/2012 |
| EP | 2553149 | A1 | 2/2013 |
| EP | 2617069 | A1 | 7/2013 |
| EP | 2674516 | A1 | 12/2013 |
| EP | 2686892 | A1 | 1/2014 |
| EP | 2704215 | A2 | 3/2014 |
| EP | 2855744 | B1 | 5/2016 |
| EP | 3053199 | A1 | 8/2016 |
| EP | 3144272 | A1 | 3/2017 |
| EP | 2006921 | B1 | 12/2018 |
| EP | 3410002 | A1 | 12/2018 |
| EP | 3410003 | A1 | 12/2018 |
| EP | 2710634 | B1 | 10/2020 |
| FR | 2952366 | A1 | 5/2011 |
| FR | 2964796 | A1 | 3/2012 |
| FR | 2969995 | A1 | 7/2012 |
| FR | 2972815 | A1 | 9/2012 |
| FR | 2974940 | A1 | 11/2012 |
| FR | 2974941 | A1 | 11/2012 |
| FR | 2975532 | A1 | 11/2012 |
| FR | 2991342 | A1 | 12/2013 |
| FR | 2991999 | A1 | 12/2013 |
| FR | 2998090 | A1 | 5/2014 |
| FR | 3011383 | A1 | 4/2015 |
| FR | 3041274 | A1 | 3/2017 |
| FR | 3046155 | A1 | 6/2017 |
| FR | 3052915 | A1 | 12/2017 |
| JP | 2004095959 | A | 3/2004 |
| JP | 2010519757 | A | 6/2010 |
| JP | 2016066765 | A | 4/2016 |
| KR | 20140118466 | A | 10/2014 |
| KR | 20170018687 | A | 2/2017 |
| KR | 20180010670 | A | 1/2018 |
| KR | 20180114413 | A | 10/2018 |
| TW | 201417339 | A | 5/2014 |
| TW | 201620163 | A | 6/2016 |
| WO | 2006138465 | A2 | 12/2006 |
| WO | 2011045289 | A1 | 4/2011 |
| WO | 2011048318 | A1 | 4/2011 |
| WO | 2012035243 | A1 | 3/2012 |
| WO | 2012123840 | A1 | 9/2012 |
| WO | 2012156620 | A2 | 11/2012 |
| WO | 2013182969 | A1 | 12/2013 |
| WO | 2015044620 | A1 | 4/2015 |

(56) References Cited

FOREIGN PATENT DOCUMENTS

| | | | |
|---|---|---|---|
| WO | 2016079505 | A1 | 5/2016 |
| WO | 2016203967 | A1 | 12/2016 |
| WO | 2017068029 | A1 | 4/2017 |
| WO | 2017102708 | A1 | 6/2017 |
| WO | 2017184686 | A1 | 10/2017 |
| WO | 2017216445 | A1 | 12/2017 |
| WO | 2018091657 | A1 | 5/2018 |
| WO | 2018139866 | A1 | 8/2018 |
| WO | 2018143682 | A1 | 8/2018 |
| WO | 2018159977 | A1 | 9/2018 |
| WO | 2018169243 | A1 | 9/2018 |
| WO | 2019092357 | A1 | 5/2019 |
| WO | 2019126539 | A1 | 6/2019 |

* cited by examiner

LASER LIFT-OFF PROCESSING SYSTEM INCLUDING METAL GRID

CROSS-REFERENCE TO RELATED APPLICATIONS

This application is the National Stage entry of PCT/US2021/020187, filed on Mar. 1, 2021, which claims priority to U.S. Provisional Application Ser. No. 62/987,915 filed on Mar. 11, 2020, the disclosures of which are incorporated herein by reference in their entireties.

TECHNICAL FIELD

The present disclosure generally relates to separation of a sapphire or other substrate from a semiconductor LED attached to CMOS substrate.

BACKGROUND

Various emerging display applications, including wearable devices, head-mounted, and large-area displays require miniaturized chips composed of arrays of microLEDs (μLEDs or uLEDs) with a high density having a lateral dimension down to less than 100 μm×100 μm. MicroLEDs (uLEDs) typically have dimensions of about 50 μm in diameter or width and smaller that are used to in the manufacture of color displays by aligning in close proximity microLEDs comprising red, blue and green wavelengths. Generally, two approaches have been utilized to assemble displays constructed from individual microLED dies. The first is a pick-and-place approach, which comprises picking up and then aligning and attaching each individual blue, green and red wavelength microLED onto a backplane, followed by electrically connecting the backplane to a driver integrated circuit. Due to the small size of each microLED, this assembly sequence is slow and subject to manufacturing errors. Furthermore, as the die size decreases to satisfy increasing resolution requirements of displays, larger and larger numbers of die must be transferred at each pick and place operation to populate a display of required dimensions.

An alternative to pick-and-place manufacture of semiconductor light-emitting devices (LEDs) or microLEDs is provided by wafer scale manufacture. Control electronics on a CMOS die can be directly attached by solder, conductive pillars, or other suitable interconnects to an LED wafer. Unfortunately, processing LED and CMOS connected dies and wafers can be difficult as compared to processing LED die or wafers alone. Complex process steps such as sapphire substrate removal, gallium cleaning, and phosphor attachment must be able to be performed with damaging CMOS die integrity and functionality.

Laser lift-off processes, which involve projecting a laser light source through a transparent material to be absorbed in an adjacent material on the backside, are a particular concern. Confined plasma at the interface between a transparent substrate (e.g. sapphire) and an absorbing material (e.g. GaN) results in lift-off or separation of the materials. Unfortunately, coatings and processing steps associated with CMOS die attachment can interfere with lift-off. For example, underfill coating between a CMOS die or wafer and an LED die or wafer can include unwanted coating of the transparent substrate, which prevents lift-off unless the underfill is first partially removed.

SUMMARY

In one embodiment, a method of manufacturing a light emitting diode (LED) device includes forming an LED structure by depositing a plurality of semiconductor layers on a transparent substrate. Trenched metal is placed in the plurality of semiconductor layers, with the trenched metal contacting the transparent substrate. The LED structure is attached to a CMOS structure with electrical interconnects that define a cavity therebetween. Laser light is used to provide laser lift-off of the transparent substrate from the plurality of semiconductor layers.

In some embodiments, an underfill material can be deposited in the cavity.

In some embodiments, the trenched metal is arranged to define a trenched grid.

In some embodiments, the transparent substrate is sapphire.

In some embodiments, the electrical interconnects are electrically conductive pillars.

In some embodiments, the plurality of semiconductor layers are GaN.

In some embodiments, the method of manufacturing a light emitting diode (LED) device includes attaching an LED structure including trenched metal within a plurality of semiconductor layers to a CMOS structure with electrical interconnects that define a cavity therebetween. Laser light is directed to provide laser lift-off of the transparent substrate from the plurality of semiconductor layers.

BRIEF DESCRIPTION OF THE DRAWINGS

Non-limiting and non-exhaustive embodiments of the present disclosure are described with reference to the following figures, wherein like reference numerals refer to like parts throughout the various figures unless otherwise specified.

To facilitate understanding, identical reference numerals have been used, where possible, to designate identical elements that are common to the figures. The figures are not drawn to scale. For example, the heights and widths of the CMOS die or wafer are not drawn to scale.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

The term "substrate" as used herein according to one or more embodiments refers to a structure, intermediate or final, having a surface, or portion of a surface, upon which a process acts. In addition, reference to a substrate in some embodiments also refers to only a portion of the substrate, unless the context clearly indicates otherwise. Further, reference to depositing on a substrate according to some embodiments includes depositing on a bare substrate, or on a substrate with one or more films or features or materials deposited or formed thereon.

In one or more embodiments, the "substrate" means any substrate or material surface formed on a substrate upon which film processing is performed during a fabrication process. In exemplary embodiments, a substrate surface on which processing is performed includes materials such as silicon, silicon oxide, silicon on insulator (SOI), strained silicon, amorphous silicon, doped silicon, carbon doped silicon oxides, germanium, gallium arsenide, glass, sapphire, and any other suitable materials such as metals, metal nitrides, III-nitrides (e.g., GaN, AlN, InN and alloys), metal alloys, and other conductive materials, depending on the application. Substrates include, without limitation, light emitting diode (LED) devices. Substrates in some embodiments are exposed to a pretreatment process to polish, etch, reduce, oxidize, hydroxylate, anneal, UV cure, e-beam cure and/or bake the substrate surface. In addition to film processing directly on the surface of the substrate itself, in some embodiments, any of the film processing steps disclosed are also performed on an underlayer formed on the substrate, and the term "substrate surface" is intended to include such underlayer as the context indicates. Thus for example, where a film/layer or partial film/layer has been deposited onto a substrate surface, the exposed surface of the newly deposited film/layer becomes the substrate surface.

The term "wafer" and "substrate" will be used interchangeably in the instant disclosure. Thus, as used herein, a wafer serves as the substrate for the formation of the LED devices described herein.

Figure 1:
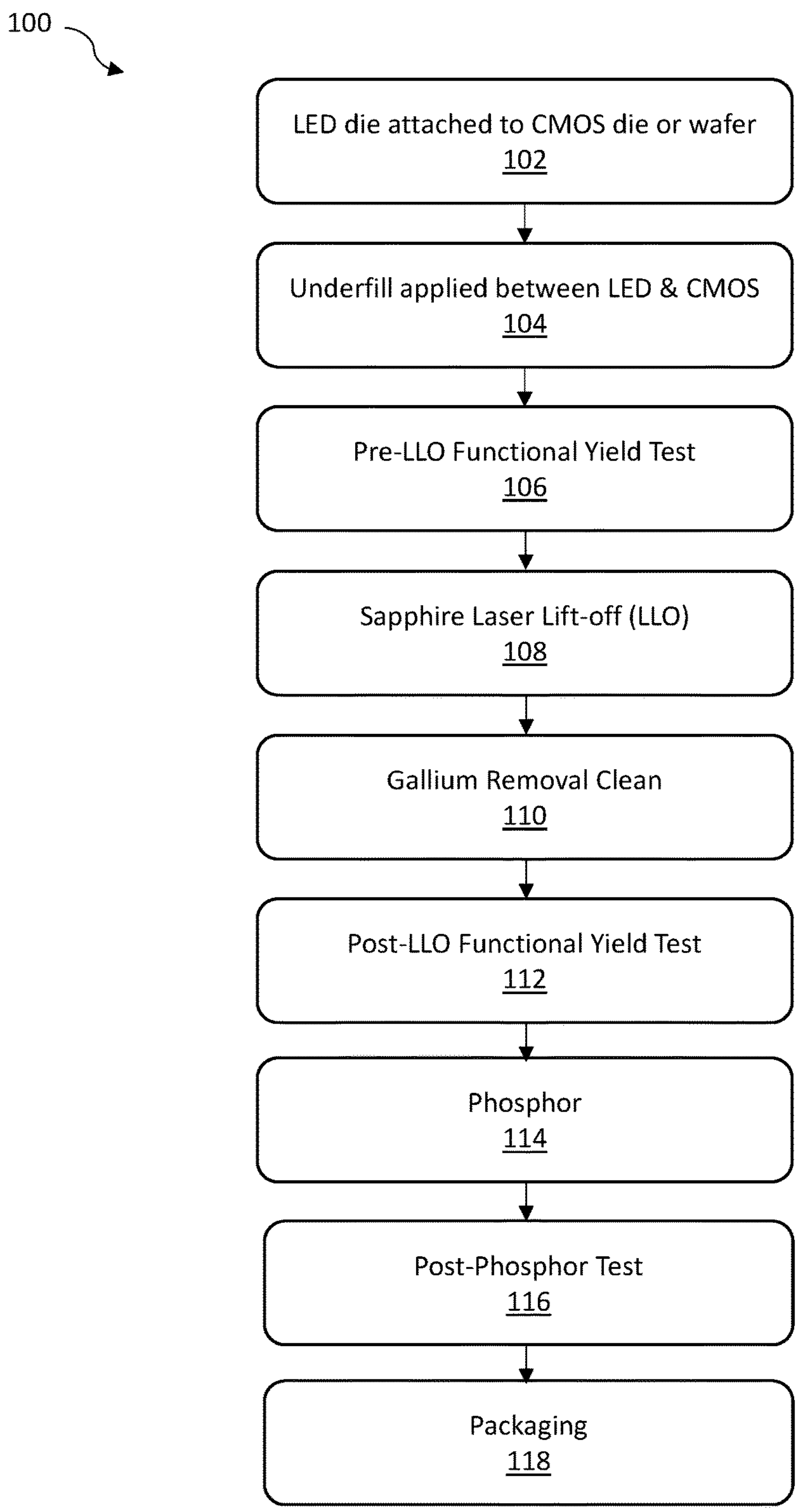
FIG. 1 is an example process flow for packaging of an LED die attached to a CMOS die or wafer.

FIG. 1 is an example process flow 100 for manufacture of an LED die attached to a CMOS die or wafer. In step 102, an LED die or wafer is attached to a CMOS die or wafer using solder, conductive pillars, conductive adhesive material, or other suitable interconnects to an LED wafer. An underfill is applied between the LED die or wafer and the attached to a CMOS die or wafer (step 104). Electrical connectivity and operation of each combined LED die or wafer and attached to a CMOS die or wafer can be tested in a pre-laser lift-off (LLO) yield test, with non-operational die marked for later discard (step 106). Transparent sapphire or other LED substrate material is removed by laser lift-off (step 108), with directed laser energy heating and vaporizing an absorbing interface material such as GaN and allowing separation. In one embodiment, GaN nitride is vaporized and broken down into nitrogen and metallic gallium. The gallium metal can be removed and cleaned using heated water (or weak acid) is used to wash away (or etch away) the gallium residue in step 110. Electrical connectivity and operation of each combined LED die or wafer and attached to a CMOS die or wafer can be tested in a post-laser lift-off (LLO) yield test, with non-operational die marked for later discard (step 112). In step 114, phosphor can be attached to the LED, and electrical connectivity and operation again tested (step 116). In a final step 118, a wafer can be diced (if necessary), and the combined CMOS die and LED packaged.

Figure 2A:
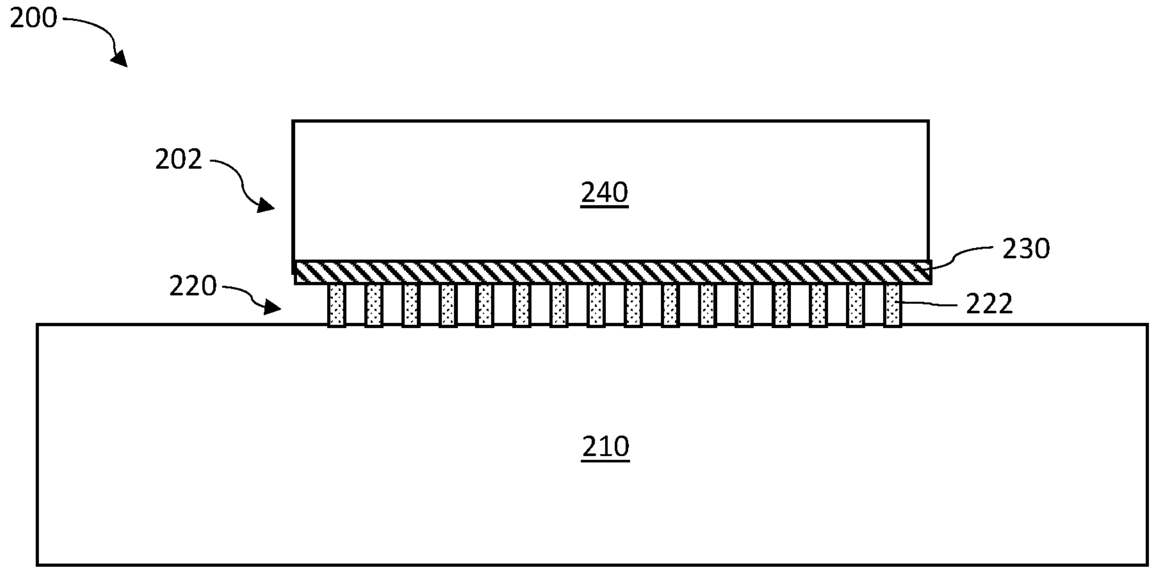
FIG. 2A illustrates an LED die attached to a CMOS die or wafer before underfill.

FIG. 2A illustrates a structure 200 that includes an LED die or wafer 202 attached to a CMOS die or wafer 210 before underfill. The LED die or wafer 202 includes a sapphire 240 or other transparent substrate that has semiconductor layers 230 including an N-type layer, an active layer, and a P-type layer that is capable of emitting light when electrically powered.

In one or more embodiments, the transparent substrate comprises one or more of sapphire, silicon carbide, silicon (Si), quartz, magnesium oxide (MgO), zinc oxide (ZnO), spinel, and the like. In one or more embodiments, the substrate is not patterned prior to the growth of the Epi-layer. Thus, in some embodiments, the substrate is not patterned and can be considered to be flat or substantially flat. In other embodiments, the substrate is patterned, e.g. patterned sapphire substrate (PSS).

In some embodiments the transparent substrate can support an epitaxially grown or deposited semiconductor N-layer. A semiconductor p-layer can then be sequentially grown or deposited on the N-layer, forming an active region at the junction between layers. Semiconductor materials capable of forming high-brightness light emitting devices can include, but are not limited to, Group III-V semiconductors, particularly binary, ternary, and quaternary alloys of gallium, aluminum, indium, and nitrogen, also referred to as III-nitride materials. In some embodiments, the III-nitride material comprises one or more of gallium (Ga), aluminum (Al), and indium (In). Thus, in some embodiments, the semiconductor layer comprises one or more of gallium nitride (GaN), aluminum nitride (AlN), indium nitride (InN), gallium aluminum nitride (GaAlN), gallium indium nitride (GaInN), aluminum gallium nitride (AlGaN), aluminum indium nitride (AlInN), indium gallium nitride (InGaN), indium aluminum nitride (InAlN), and the like. In one or more specific embodiments, the semiconductor layer 104 comprises gallium nitride and is an n-type layer.

Electrical and mechanical connection between the CMOS chip or wafer 210 can be provided by electrically conductive pillars 222. The pillars define a cavity or gap 220 that can be filled with an underfill material to improve mechanical stability and attachment, and also improve electrical isolation.

Figure 2B:
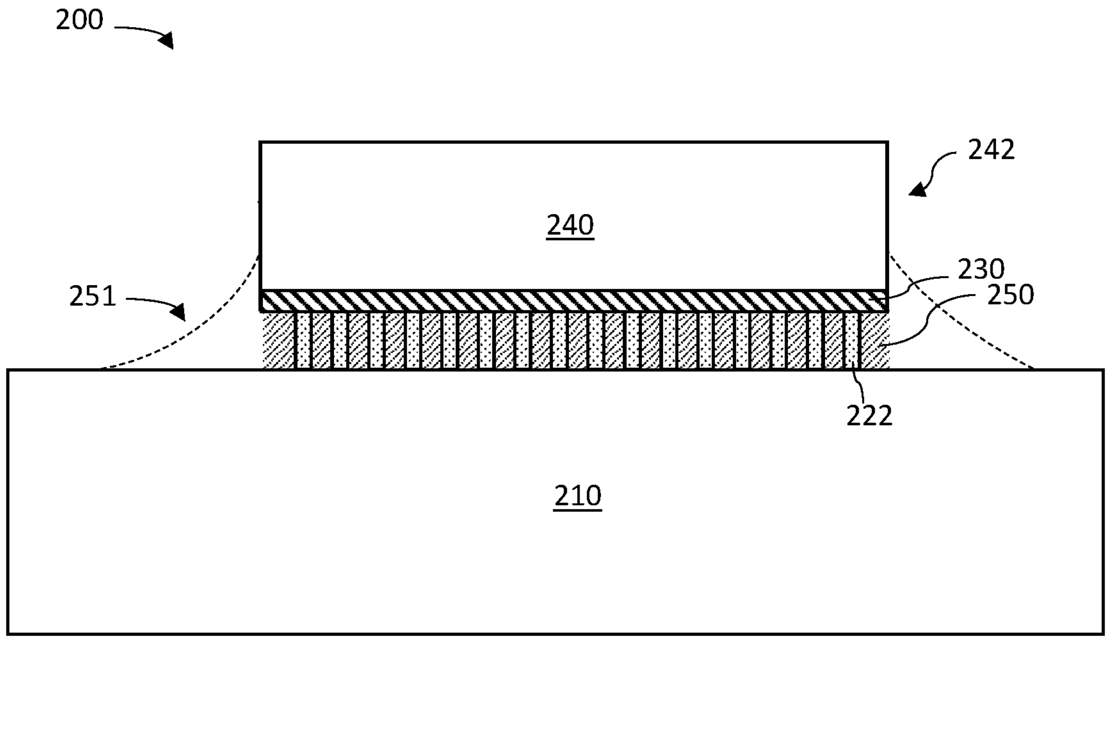
FIG. 2B illustrates an LED die attached to a CMOS die or wafer after underfill.

FIG. 2B illustrates the structure 200 of FIG. 2B with underfill 250 in place. In this embodiment, the underfill has been removed from areas outside cavity 220. Without removal or use of other techniques such as described with respect to FIGS. 3A and 3B, underfill would typically form a fillet (denoted by dotted line 251) that makes contact with a sidewall 242 of the sapphire 240. Unfortunately, such an underfill fillet 251 contacting and adhesively retaining the sapphire sidewall 242 may prevent sapphire 240 removal by laser lift-off or require additional underfill removal steps.

Figure 3A:
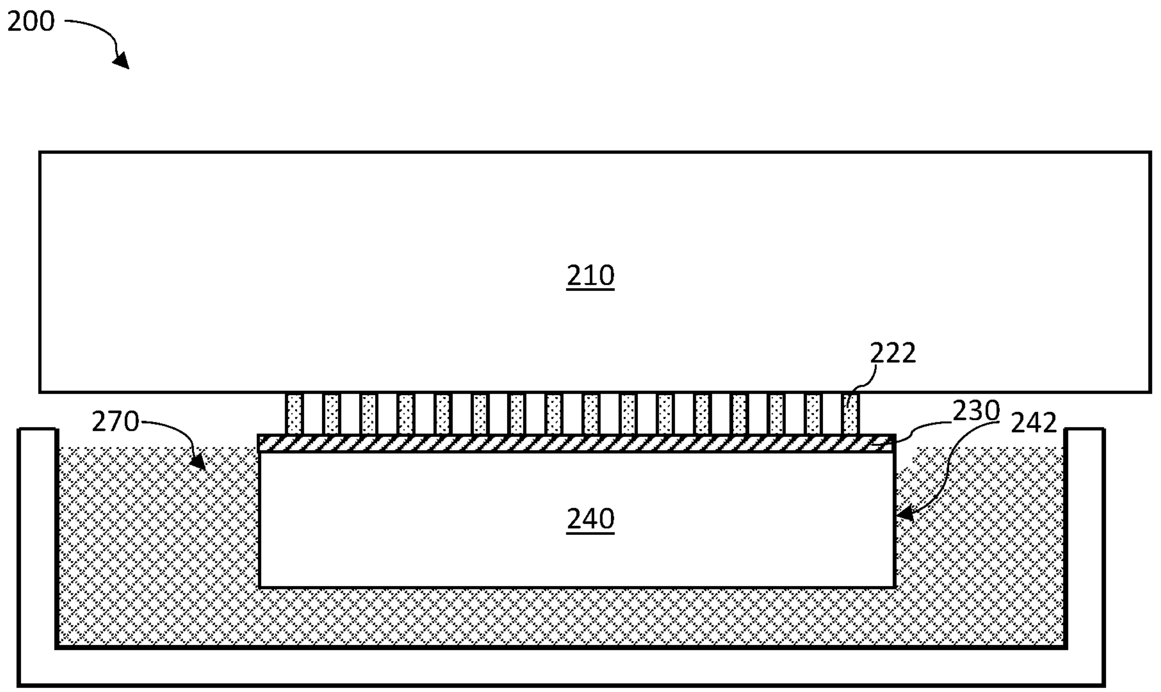
FIG. 3A illustrates coating an LED die attached to a CMOS die or wafer with an anti-stick coating.

With reference to FIG. 3A the sidewall 242 of an LED die (with sapphire substrate 240) attached to a CMOS die or wafer 210 can optionally be coated with an anti-stick coating 270. The anti-stick coating can be a hydrophobic liquid or other anti-stiction material (e.g., such as liquid Teflon) into which the sapphire 240 is dipped. Care must be taken to not to allow anti-coating material to get into the cavity between the LED and CMOS, since capillary action would soak up the coating and prevent underfill from adhering within the cavity in later processing steps.

Figure 3B:
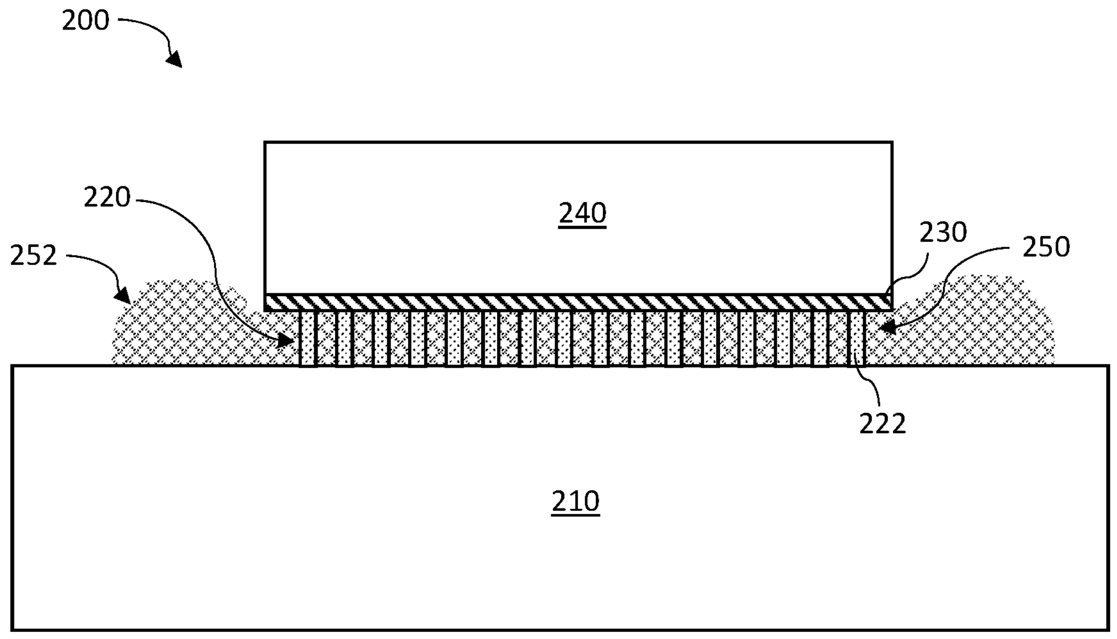
FIG. 3B illustrates an LED die attached to a CMOS die or wafer after underfill.

FIG. 3B illustrates an LED die attached to a CMOS die or wafer after the optional coating of sapphire 240 and sidewalls 242 with anti-stick coating material 270. When placed in the cavity between the LED die and wafer and the CMOS chip or wafer, underfill 250 can further include some excess underfill material 252. This excess material 252 can still contact the CMOS chip or wafer 210 but is not positioned within the cavity. However, since it does not contact the sapphire 240 and sidewalls 242 due to the earlier application of anti-stick coating material 270, there is no interference with laser lift-off.

Figure 4:
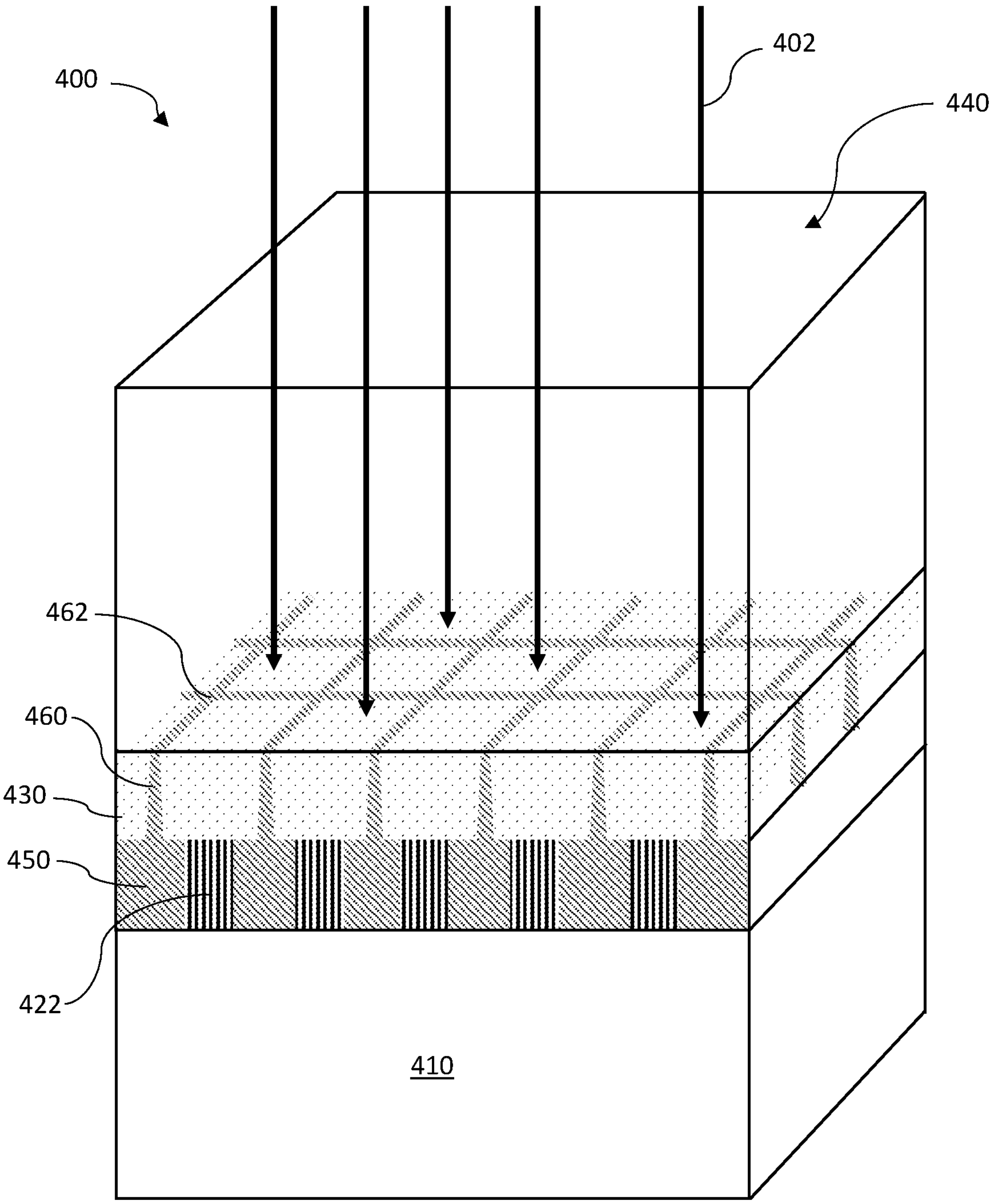
FIG. 4 illustrates in perspective view removal of sapphire from contact with the LED die and included trenched metal grid.

FIG. 4 illustrates in perspective view a structure 400 that allows for laser lift-off removal of sapphire 440 from contact with the LED die and included trenched metal grid 460. The structure 400 includes and LED die with semiconductor layers 430 attached to a CMOS chip or wafer 410. Similar to the embodiment discussed with respect to FIGS. 2A and 2B, electrical and mechanical connection between the CMOS chip or wafer 410 and the semiconductor layers 430 is provided by electrically conductive pillars 422. The pillars define a cavity or gap that can be filled with an underfill material 450 to improve mechanical stability and attachment, and also improve electrical isolation.

In this embodiment the semiconductor layers 430 include trenched metal 460 that together forms a trenched metal grid 462. In effect, trenches can help define a plurality of spaced mesas that in turn define pixels, with each of the plurality of spaced mesas comprising the semiconductor layers and each of the spaced mesas having a height less than or equal to their width. The trenched metal 460 is deposited in a space between each of the plurality of spaced mesas, the metal both providing optical isolation between each of the spaced mesas and allowing electrical contact with sidewalls of the GaN LED. In one embodiment, electrical contact can include electrically contacting the N-type layer of each of the spaced mesas along sidewalls of the N-type layers. The space between each of the plurality of spaced mesas can result in a pixel pitch in a range of from 1 μm to 100 μm and space between adjacent edges of the p-contact layer of less than 10% of the pixel pitch when the pixel pitch is in a range of from 10 um to 100 um and when the pixel pitch is in a range of 1 um to 10 um, the space gap is less than or equal to 5 μm and greater than 0.5 μm.

In some embodiments, the trenched metal 460 comprises a reflective metal. In some embodiments, the trench metal width is less than or equal to 4 μm and greater than 0.5 μm or less than or equal to 3 μm and greater than 0.5 μm. In some embodiments, the plurality of spaced mesas between trenched metal grid 462 is arranged into pixels, and the pixel pitch ranges from 5 μm to 100 μm or from 30 μm to 50 μm. In some embodiments, the semiconductor layers 430 have a thickness in a range of from 2 μm to 10 μm.

Since the trenched metal 460 is attached between the sapphire 440 and the semiconductor layers 430 of the LED die, sapphire lift-off requires breaking connection with the metal 460. In this embodiment, laser light 402 decomposes the GaN (or other semiconductor material 430) to create separation from the sapphire 440. While the laser energy is not high enough to cause decomposition and direct release of the metal 460, in regions where the area of GaN is sufficiently greater than the area of the metal 460 the force of nitrogen gas expansion from decomposition of GaN causes separation of metal from sapphire.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is claimed is:

1. A method of manufacturing a light emitting diode (LED) device, comprising:

forming an LED structure by depositing a plurality of semiconductor layers on a transparent substrate;

placing trenched metal in the plurality of semiconductor layers, with the trenched metal contacting the transparent substrate, wherein the trenched metal is arranged to define a trenched grid;

attaching the LED structure to a complementary metal-oxide-semiconductor (CMOS) structure with electrical interconnects that define a cavity therebetween;

coating a sidewall of the transparent substrate with an anti-stick material, wherein there is no anti-stick material in the cavity, then depositing an underfill material in the cavity, wherein the underfill material does not contact the sidewall of the transparent substrate;

removing the underfill material from areas outside of the cavity; and directing laser light to provide laser lift-off of the transparent substrate from the plurality of semiconductor layers.

2. The method of manufacturing a light emitting diode (LED) device of claim 1, wherein the transparent substrate is sapphire.

3. The method of manufacturing a light emitting diode (LED) device of claim 1, wherein the electrical interconnects are electrically conductive pillars.

4. The method of manufacturing a light emitting diode (LED) device of claim 1, further comprising coating a sidewall of the transparent substrate with anti-stick coating.

5. The method of manufacturing a light emitting diode (LED) device of claim 4, wherein the transparent substrate is dipped into anti-stick material to coat the sidewall.

* * * * *